US011985743B2

(12) United States Patent
Syed

(10) Patent No.: US 11,985,743 B2
(45) Date of Patent: May 14, 2024

(54) SINGLE RAIL CONTROL SYSTEM WITH RECEIVER MODULES

(71) Applicant: Corsair Memory, Inc., Fremont, CA (US)

(72) Inventor: Taniyyus Fahim Syed, Fremont, CA (US)

(73) Assignee: Corsair Memory, Inc., Milpitas, CA (US)

( * ) Notice: Subject to any disclaimer, the term of this patent is extended or adjusted under 35 U.S.C. 154(b) by 64 days.

(21) Appl. No.: 17/331,535

(22) Filed: May 26, 2021

(65) Prior Publication Data

US 2023/0007746 A1    Jan. 5, 2023

(51) Int. Cl.
*H05B 45/3725* (2020.01)
*H05B 47/18* (2020.01)
*H05K 7/20* (2006.01)

(52) U.S. Cl.
CPC ......... *H05B 45/3725* (2020.01); *H05B 47/18* (2020.01); *H05K 7/20172* (2013.01); *H05K 7/20209* (2013.01)

(58) Field of Classification Search
CPC .... H05B 45/3725; H05B 47/18; H05B 45/20; H05B 45/00; H05B 47/185; H05K 7/20172; H05K 7/20209; G06F 1/18; G06F 1/206; G06F 1/266; F21S 8/00; F21V 23/003; F21V 29/56; F21V 29/59; F21V 29/60; F21V 29/61; F21Y 2115/10
See application file for complete search history.

(56) References Cited

U.S. PATENT DOCUMENTS

| 10,448,491 | B1* | 10/2019 | Recker | H05B 47/16 |
| 2012/0188172 | A1* | 7/2012 | Fong | G06F 3/0412 |
| | | | | 345/173 |
| 2019/0086528 | A1* | 3/2019 | Steiner | G01S 13/04 |
| 2019/0189042 | A1* | 6/2019 | Aurongzeb | G06F 1/1681 |
| 2019/0335551 | A1* | 10/2019 | Williams | H05B 45/24 |
| 2021/0121658 | A1* | 4/2021 | Causey | G16H 40/67 |

FOREIGN PATENT DOCUMENTS

| CN | 105308657 A | * | 2/2016 | | G01K 1/14 |
| JP | 2012170780 A | * | 9/2012 | | |
| JP | 2012223582 A | * | 11/2012 | | A61B 17/320092 |

* cited by examiner

*Primary Examiner* — Abdullah A Riyami
*Assistant Examiner* — Syed M Kaiser
(74) *Attorney, Agent, or Firm* — Carina M. Tan; Corsair Memory, Inc.

(57) ABSTRACT

A single rail control system with receiver modules associated with a motherboard of a personal computer and a power supply, comprises a transmitter module, a connector module, and at least one receiver module. One of the first microcontrollers of the transmitter module is controlled by the motherboard or software running on the system/CPU. The connector module is associated with the transmitter module, the power supply, and the receiver module. The connector module is able to be connected in series to increase the number of the receiver module. The receiver module is able to simultaneously receive the control instruction of the first microcontroller and the power provided from the power supply through the connector module, so that a plurality of RGB LEDs are controlled by one of the second microcontrollers of the receiver module to emit light to the outside. Since the receiver module does not require additional power cables, the unnecessary wires can be effectively reduced.

9 Claims, 7 Drawing Sheets

SINGLE RAIL CONTROL SYSTEM WITH RECEIVER MODULES

TECHNICAL FIELD

The present invention relates to a control system for emitting light, more particularly relates to a single rail control system with receiver modules.

DESCRIPTION OF THE PRIOR ART

In order to have colorful lighting effects on a computer chassis, an end-user can install computer components with light-emitting elements in the computer chassis. The computer components with light-emitting elements can be classified into two types. One is directly mounted on the motherboard, such as a memory directly installed on the motherboard, which does not require an additional transmission line or power cable. The other type must be associated with the motherboard through transmission lines, such as an RGB fan installed on the chassis or an RGB water pump installed on the CPU.

However, a limited number of transmission interfaces (such as USB interfaces) provided on the motherboard restricts the number of light-emitting computer components. In addition, the transmission interfaces of the motherboard cannot provide the light-emitting computer components with enough energy, so the light-emitting computer components must also be provided with a power cable to receive enough power from the power supply. In such a case, the number of wires in the chassis will be unavoidably increased.

Refer to U.S. patent Ser. No. 10/514,732B2, it relates to a smart computer case. The smart computer case is provided with a micro controller unit, a plurality of computer case fans, an RGB LED logo, an integrated lighting feature, and a power supply. A plurality of light-emitting elements (LEDs) are configured in the plurality of computer case fans. The micro controller unit is associated with the transmission interface of the motherboard, and the plurality of computer case fans and the RGB LED logo are associated with the micro controller unit, so that the smart computer can send the instructions for controlling the light or fan speed of the plurality of computer case fans, as well as the color and intensity of the light.

The micro controller unit can transmit data, but cannot provide enough power to the plurality of computer case fans. Therefore, the plurality of computer case fans must require additional power cables to receive enough power, so the computer case will be avoidably stuffed with many wires. Not only will such an arrangement cause a messy space, but it will also increase the difficulty of the wiring configuration. In addition, the number of transmission interfaces on the micro controller unit is restricted, which also restricts the number of computer case fans.

The conventional controlling system with light-emitting computer components has the following disadvantages:

1. Restricted Component Number

Since a limited number of transmission interfaces (such as USB interfaces) provided on the motherboard restricts the number of light-emitting computer components, the number of light-emitting elements on the chassis is also restricted, so that a conventional chassis is difficult to configure with more light-emitting elements.

2. Increased Number of Wires

The microcontroller associated with the motherboard can only transmit data, but cannot provide the plurality of light-emitting elements with enough power, so that the plurality of light-emitting elements must require additional power cables to receive power, which will increase the wires in the chassis.

3. Restricted Configuration

The light-emitting elements installed in various locations of the chassis are connected by the microcontroller or power supply. The common light-emitting elements have fixed wire length. When the distance between the light-emitting elements in the chassis and the microcontroller or power supply is too far, the wire is not long enough for connecting the microcontroller and the power supply, which will restrict the location of the light-emitting elements.

Therefore, it is desirable to provide a larger number of light-emitting elements in the chassis with reduced number of wires in the chassis to simplify the wiring configuration of the light-emitting elements in the chassis.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the figures.

DESCRIPTION OF EMBODIMENTS

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

Figure 1:
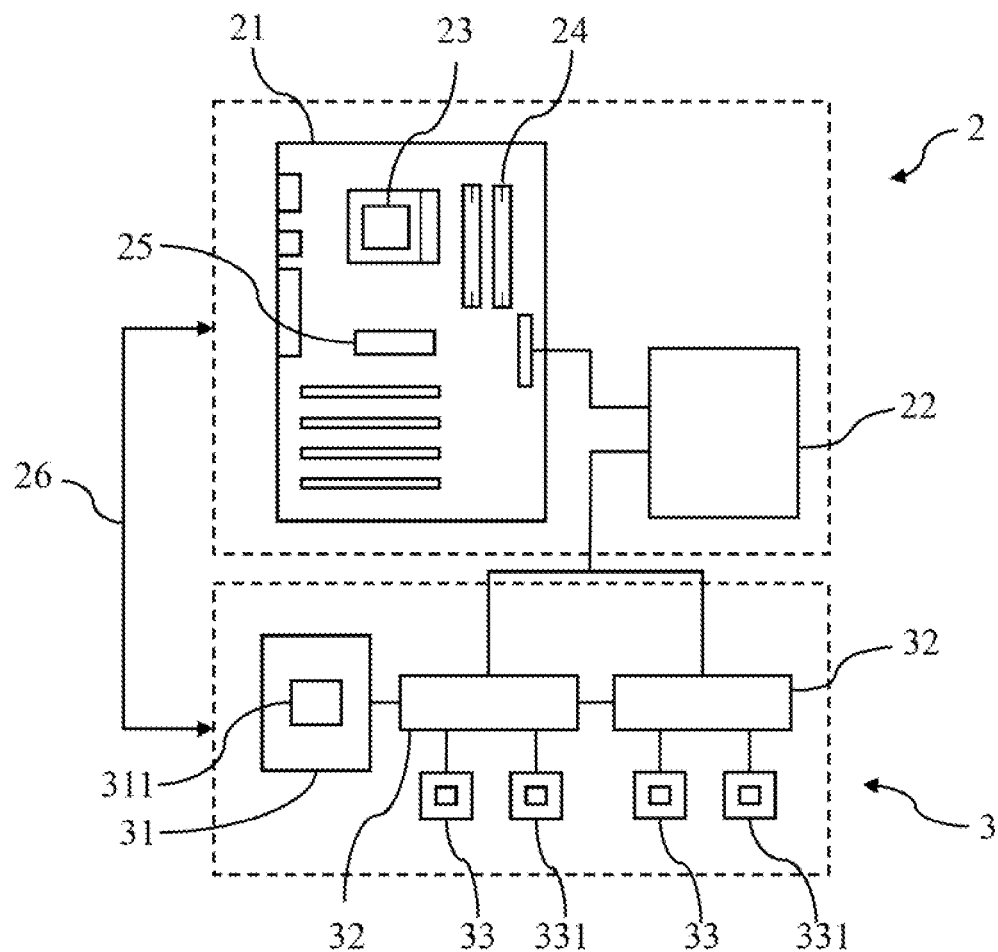
FIG. 1 illustrates a block diagram of a single rail control system with receiver modules, according to certain embodiments.

FIG. 1 illustrates a block diagram of a single rail control system with receiver modules. The single rail control system 3 can be installed in a computer 2. Generally, the computer 2 will be provided with a motherboard 21 and a power supply 22. The motherboard 21 will be equipped with a CPU 23, at least one memory module 24, and at least one storage device 25 (e.g., SSD). The storage device 25 can store application programs and thereby allow the computer 2 to execute digital instructions, so that the computer 2 can control other microcontrollers.

The single rail control system 3 comprises a transmitter module 31, at least one connector module 32, and at least one receiver module 33. The transmitter module 31 is associated with at least one connector module 32 (FIG. 1 shows a plurality of connector modules 32 in a series connection). Each of the plurality of connector module 32 is associated with at least one receiver module 33 (FIG. 1 shows two receiver modules 33 associated with each connector module 32). The transmitter module 31 has a first microcontroller 311, and each receiver module 33 has a second microcontroller 331. Through the above configuration, the first microcontroller 311 and the second microcontroller 331 can transmit/control data.

Each of the plurality of connector module 32 is able to be associated with the power supply 22. The computer 2 and the single rail control system 3 can communicate via wire/wireless transmission, and form a communication channel 26. A communication application program stored in the storage device 25 can be executed by the CPU 23 of the computer 2, so that the CPU 23 can communicate with the first microcontroller 311. The CPU 23 transmits data to the first microcontroller 311 via the communication channel 26, and thereby controls the first micro-controller 311, so that the CPU 23 of the computer 2 can control the plurality of receiver modules that are associated with the transmitter module 31. The communication channel 26 can be wireless transmission (including WIFI, Bluetooth, etc.) or wired transmission (including USB, PCIe, etc.) for data transmission.

Figure 2:
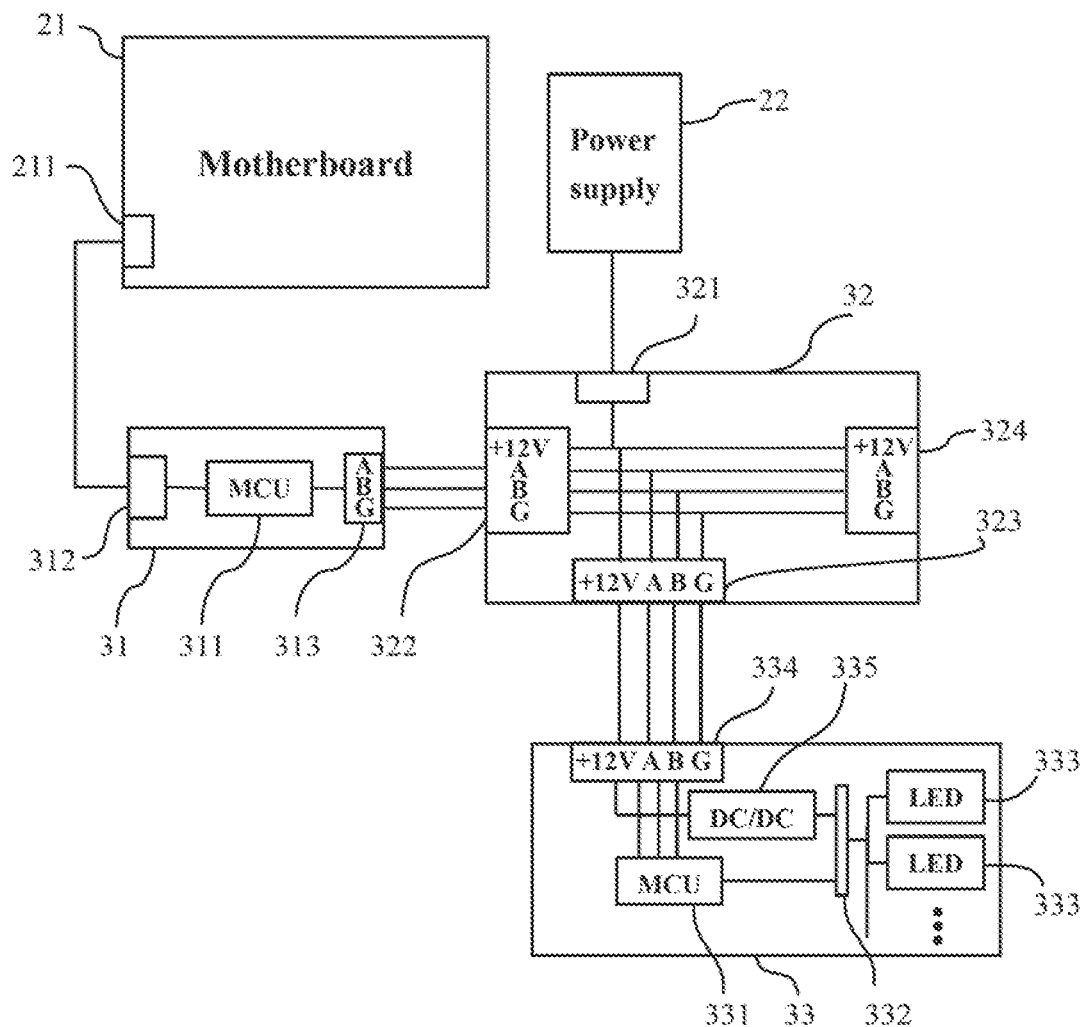
FIG. 2 illustrates a block diagram of a single rail control system with receiver modules comprising a transmitter module, a connector module, and a receiver module, according to certain embodiments.

Refer to FIG. 2, the transmitter module 31 includes a first microcontroller 311, a control interface 312 associated with the first microcontroller 311, and a data interface 313 associated with the first microcontroller 311. The motherboard 21 is provided with a USB interface 211, and the USB interface 211 is associated with the control interface 312 through a set of transmission lines, so that the motherboard 21 as well as other components can read/write/control the data in the first microcontroller 311.

The connector module 32 includes a power connector 321 provided for electrical connection with the power supply 22, a transmission interface 322 associated with the data interface 313 of the transmitter module 31, an emitter interface 323 associated with the power connector 321 and the transmission interface 322, and an expansion interface 324 associated with the transmission interface 322. According to certain embodiments, when the number of the connector module 32 is one, the expansion interface 324 may not be provided on the connector module 32.

The receiver module 33 includes a second microcontroller 331 associated with the emitter interface 323 of the connector module 32, an LED driver 332 associated with the second microcontroller 331, a plurality of RGB LEDs 333 associated with the LED driver 332, a connector interface 334 associated with the second microcontroller 331, and a DC/DC converter 335 associated with the connector interface 334 and the LED driver 332. According to certain embodiments, the number of RGB LEDs 333 can be one, and may vary from implementation to implementation.

The receiver module 33 is an RGB light strip, and may vary from implementation to implementation. The plurality of RGB LEDs 333 are composed of red LEDs, green LEDs, and blue LEDs, and the light colors can have various combinations.

The first microcontroller 311 and the second microcontroller 331 is bi-directional, and data is transmitted through the connector module 32. The power provided from the power supply 22 is transmitted to the receiver module 33 through the connector module 32. In such way, the first microcontroller 311 can control the second microcontroller 331, and the plurality of RGB LEDs 333 is driven by the LED driver 332 to emit light.

According to certain embodiments, the computer 2 is a common desktop computer device, so the motherboard 21 will serve as the control interface. As a non-limiting example, the computer 2 can be another control host (such as a programmable control device (PLC) or a control module (such as Raspberry Pi)), and it is also possible to pair with the mobile phone to store, read, or control the first microcontroller 311 via wired or wireless transmission, and may vary from implementation to implementation.

The power connector 321 of the connector module 32 is a SATA interface for receiving power (DC+12V) provided from the power supply 22, according to certain embodiments. The data interface 313 of the transmitter module 31 is composed of a contact A, a contact B, and a grounding contact. The transmitter module 31 cannot provide power. The transmission interface 322, the emitter interface 323, and the expansion interface 324 of the connector module 32 have +12V contacts, contacts A, contacts B, and grounding contacts. The connector interface 334 of the receiver module 33 also has the +12V contact, contact A, contact B, and grounding contact. The contacts A, contacts B and grounding contacts are used to transmit serial data. The +12V contacts and grounding contacts are used to transmit power. A set of wires configured between the emitter interface 323 of the connector module 32 and the connector interface 334 of the receiver module 33 can transmit power and data. The power transmission lines and data transmission lines share the same ground wire to reduce the number of wires in the chassis. The +12V contacts, contacts A, contacts B, and grounding contacts are the electrode contacts in the port or plug, which are similar to the four electrode contacts in the Type-A USB interface.

The DC/DC converter 335 is associated with the connector module 32 through the connector interface 334 to receive power (DC+12V) provided from the power supply 22, and the output power (DC+12V) of the power supply 22 is converted into power (DC+5V) used by the LED driver 332. According to certain embodiments, the DC/DC converter 335 can be replaced by other transformer devices, and may vary from implementation to implementation.

Figure 3:
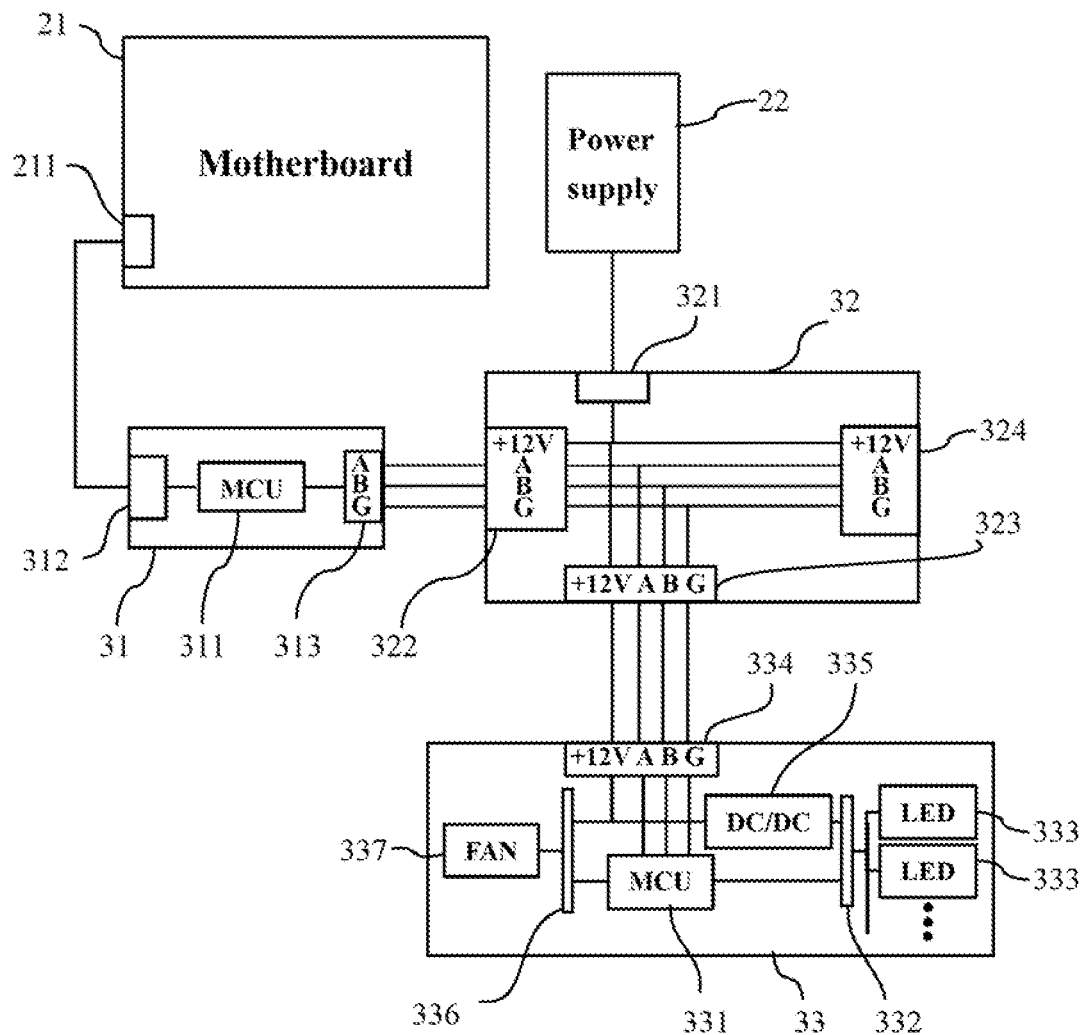
FIG. 3 illustrates a block diagram of a single rail control system with receiver modules comprising a transmitter module, a connector module, and a receiver module with a fan, according to certain embodiments.

Refer to FIG. 3, the receiver module is an RGB fan, and includes a fan driver 336 associated with the second microcontroller 331, and a fan 337 associated with the fan driver 336. The fan driver 336 is associated with the connector interface 334, so as to be associated with the emitter interface 323 of the connector module 32. The second microcontroller 331 is controlled by the first microcontroller 311 through the connector module 32, so that the fan 337 is driven to rotate by the fan driver 336 and the rotation speed is controllable.

The computer stores the instructions for controlling the plurality of RGB LEDs 333 and the fan 337 in the first microcontroller 311 through the motherboard 21, so that the second microcontroller 331 can be controlled by the first microcontroller 311. In such way, the plurality of RGB LEDs are driven to emit light, and the fan is driven to rotate. Besides, the rotation speed of the fan 337 is detected by the fan driver 336, and the detected data is transmitted to the computer by the first microcontroller 311 and the second microcontroller 331.

Figure 4:
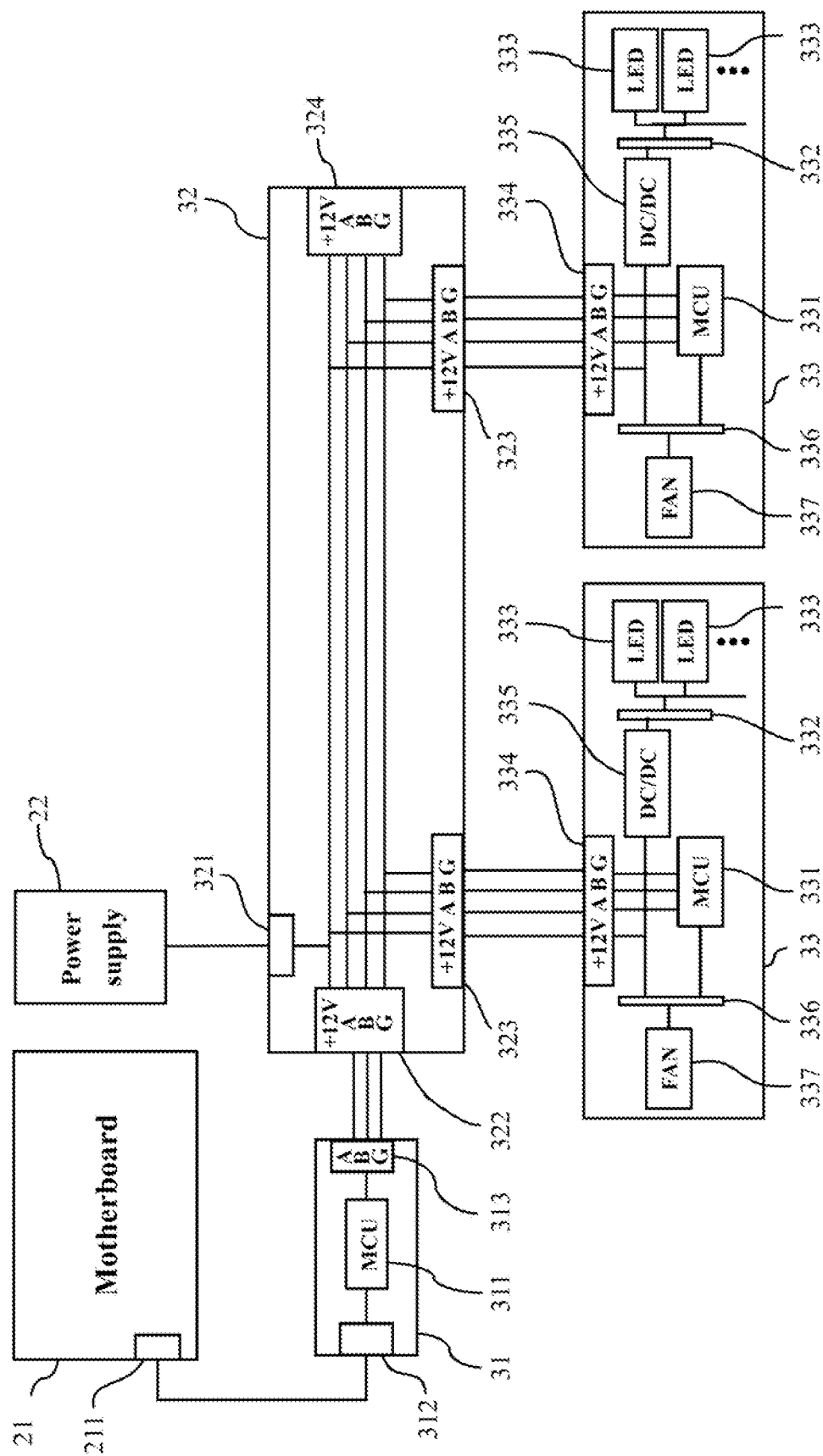
FIG. 4 illustrates a block diagram of a single rail control system with receiver modules comprising a transmitter module, a connector module and two receiver modules, according to certain embodiments.

Refer to FIG. 4, the connector module 32 is provided with a plurality of emitter interfaces 323. The plurality of emitter interfaces 323 are associated with the transmission interface 322 and the power connector 321. The plurality of receiver modules 33 can be associated with the plurality of emitter interfaces 323.

Since the connector module 32 is not provided with any control chip, each of the plurality of second microcontrollers 331 is directly associated with the first microcontroller 311 through the transmission line in the connector module 32, so that the control instructions output by the first microcontroller 311 will be simultaneously sent to the plurality of second microcontroller 331. The control instructions contain addressable data, and the plurality of second microcontrollers 331 has its own identification data. When the identification data match the addressable data, the second microcontroller 331 with the identification data will execute the control instruction to have addressable control effects. In addition, the return data of the second microcontroller 331 are also addressable, so that the first microcontroller 311 can identify the origin of the return data.

Figure 5:
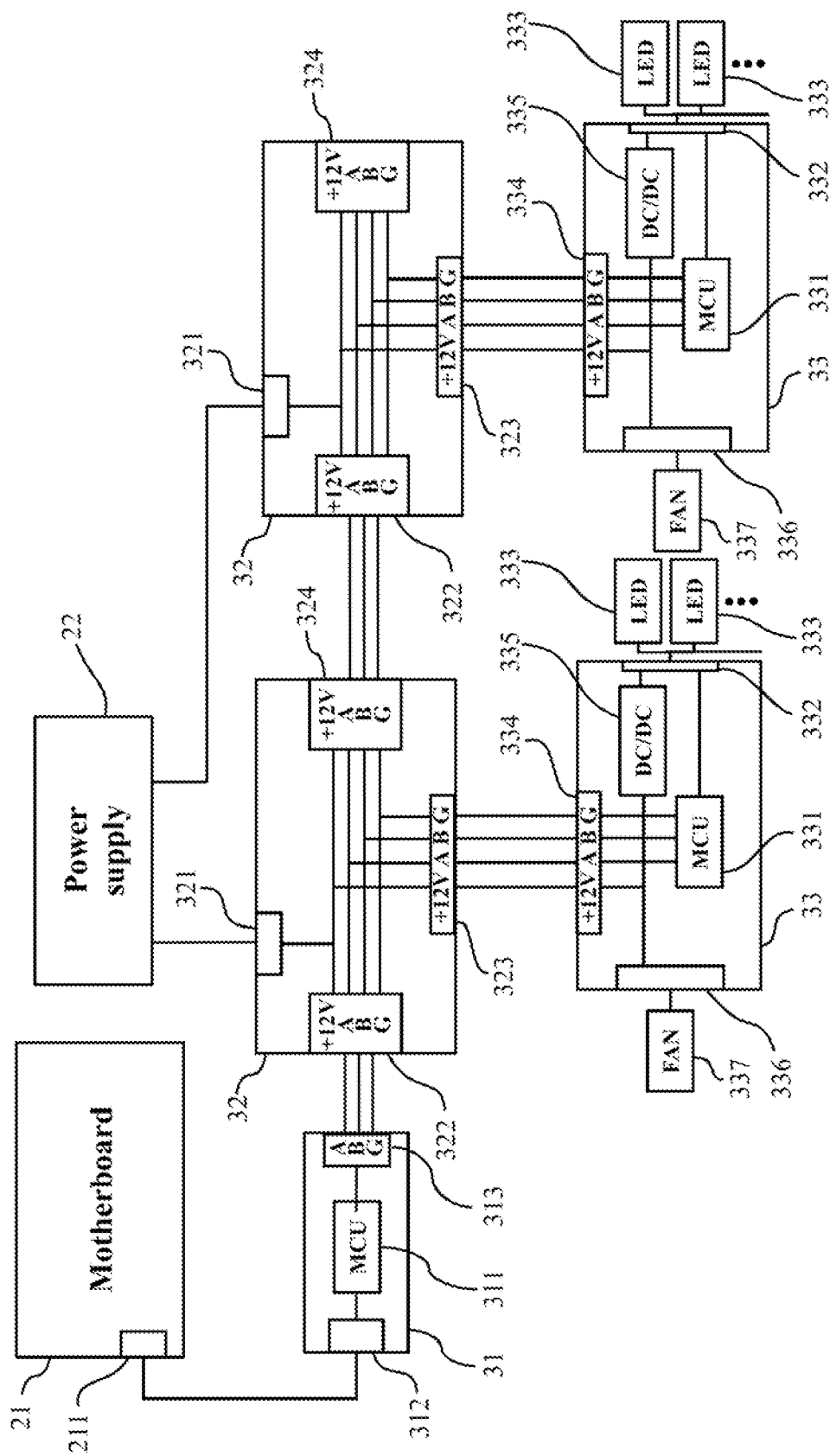
FIG. 5 illustrates a block diagram of a single rail control system with receiver modules, in which a transmitter module is associated with two connector modules, and the two connector modules are associated with a receiver module, according to certain embodiments.

FIG. 5, the number of the connector module 32 is plural and is set in series. The expansion interface 324 of the first connection module 32 associated with the transmitter module 31 is associated with the transmission interface 322 of another connector module 32. Each of the connector modules 32 can be provided with at least one emitter interface 323. The single rail control system also uses addressable control to control the dedicated second microcontroller 331.

Each power connector 321 of the plurality of connector modules 32 is associated with the power supply 22 to receive power provided for the plurality of receiver modules 33. According to certain embodiments, the power can also be transmitted through the transmission interface 322 and the expansion interface 324, and may vary from implementation to implementation. As a non-limiting example, the contact A, contact B, and grounding contact are provided in the transmission interface 322 and the expansion interface 324 can transmit data, and the +12V contact and grounding contact can transmit power. Therefore, at least one connection module 32 is required to be associated with the power supply 22, and the power can be distributed to other connector modules 32 to provide power for the plurality of receiver modules 33.

Figure 6:
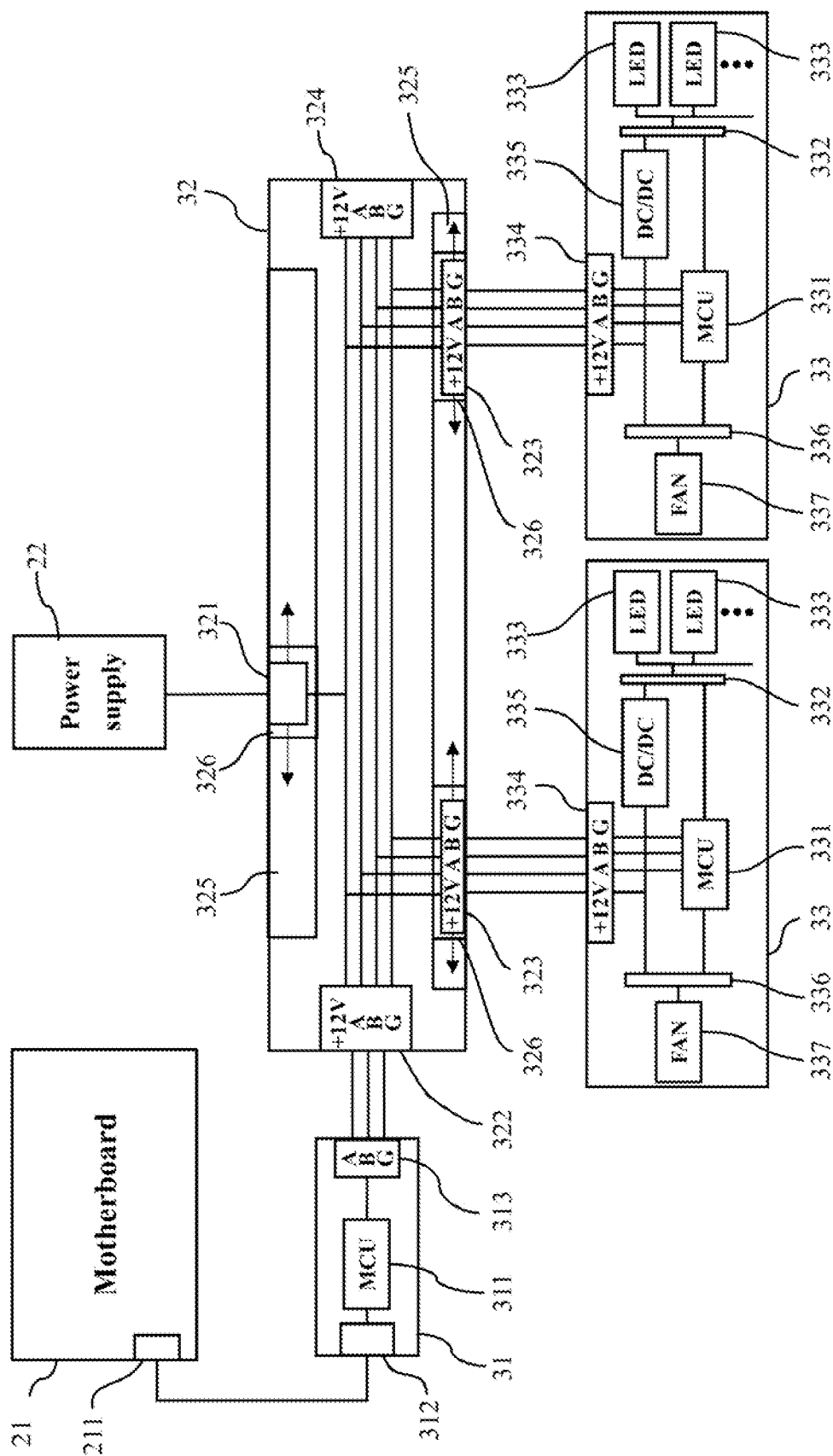
FIG. 6 illustrates a block diagram of a single rail control system with receiver modules comprising a transmitter module, a connector module, and a receiver module with a guide rail, according to certain embodiments.

Refer to FIG. 6, the connector module 32 is provided with two guide rails 325, and at least one slider block 326 configured in the two guide rails 325. The slider block 326 can slide in the guide rail 325, and the power connector 321 and the plurality of emitter interfaces 323 sits on the plurality of slider blocks 326, so that the power connector 321 and the plurality of emitter interfaces 323 can be adjusted to respective corresponding locations.

The slider block 326 provided with the power connector 321 is configured in one of the guide rails 325, and the slider block 326 provided with the emitter interface 323 is configured in the other guide rail 325. According to certain embodiments, the plurality of slider blocks 326 can be configured in the same guide rail 325, the transmission interface 322 and the expansion interface 324 can even be configured on the slider block 326, and may vary from implementation to implementation.

Preferably, the plurality of connector modules 32 can be extended to various locations in the chassis by means of series connection, and the power connector 321 and the plurality of emitter interfaces 323 can be adjusted to respective corresponding locations by the guide rail 325 and the slider block 326. Therefore, the wiring configuration can be adjusted depending on where the power supply 22 and the plurality of receiver modules 33 are located in the chassis. In such way, the problem that the power supply 22 or the receiver module 33 is hard to install due to the short wire length can be prevented.

Figure 7:
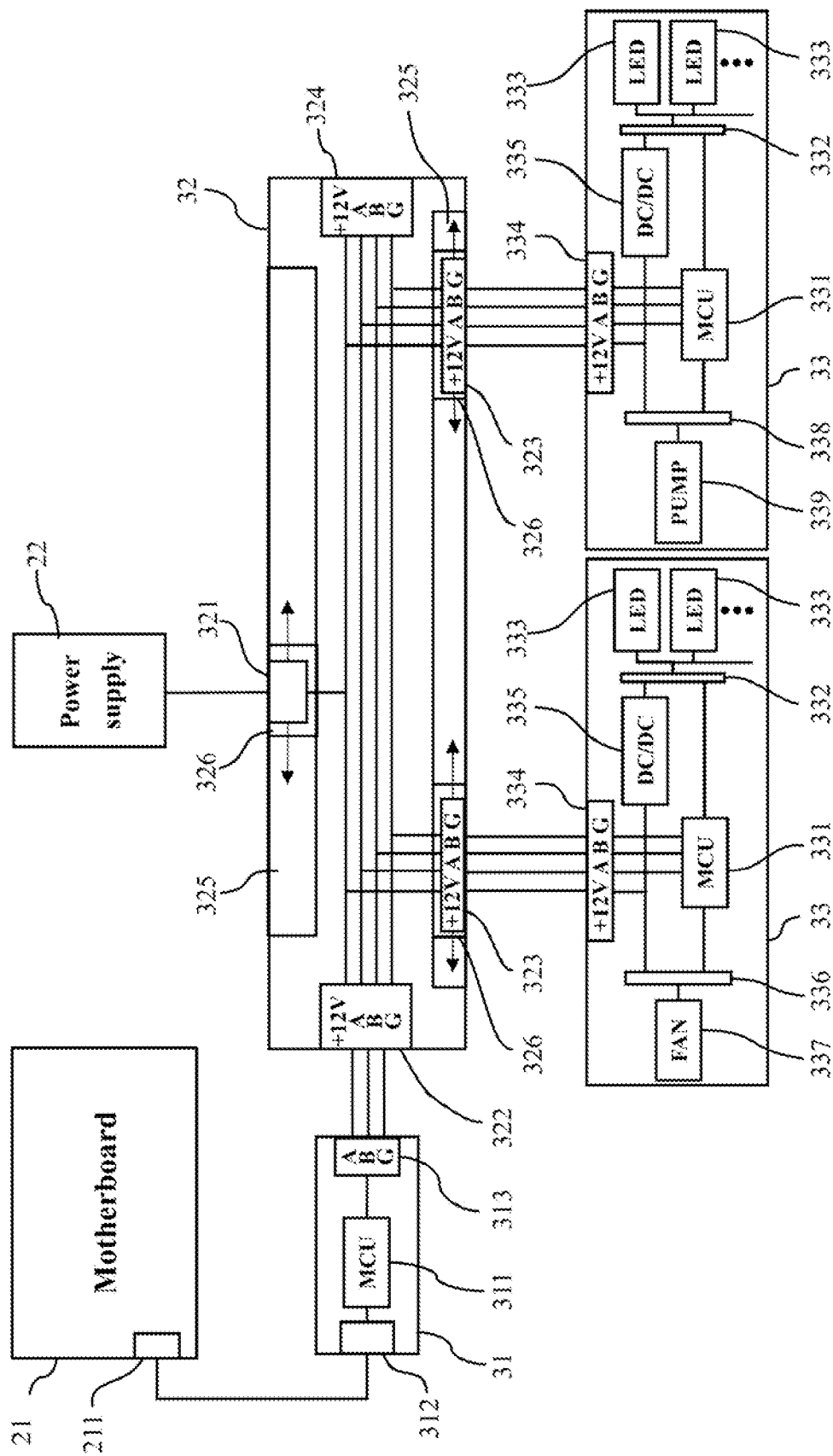
FIG. 7 illustrates a block diagram of a single rail control system with receiver modules, in which a transmitter module is associated with a connector module, and the connector module is associated with two receiver modules, wherein one of the receiver modules is equipped with a fan, and another one is equipped with a water block with pump, according to certain embodiments.

Refer to FIG. 7, the receiver module 33 can be an RGB water block used in a CPU, and includes a pump driver 338 associated with the second microcontroller 331, and a water block with pump 339 associated with the pump driver 338. The pump driver 338 is associated with the connector interface 334 to receive required power. The second microcontroller 331 is controlled by the first microcontroller 311, so that the pump driver 338 is controlled to drive the water block with pump 339 to rotate, and the rotation speed is controllable. The rotation speed of the water block with pump 339 is detected by the pump driver 338, and the detected data is transmitted to the computer through the second microcontroller 331 and the first microcontroller 311.

According to certain embodiments, one of the receiver modules 33 is an RGB fan, and the other receiver module is an RGB water block. The computer can store different control parameters in the first microcontroller 331, and the first microcontroller 311 uses the addressable control to control the dedicated receiver module 33. In such way, the light emitted from each of the plurality of RGB LEDs 333, and the rotation speed of the fan 337 and the water block with pump 339 are controllable.

With the above description, the invention of a single rail control system with receiver modules has following features:

1. Increasable Component Number

The transmission interface 322 of the connector module 32 can be associated with the expansion interface 324 of another connector module 32, so as to increase the number of the connector modules 32 in a series connection. Therefore, the number of the emitter interface 323 can be increased, a large number of receiver modules 33 can be installed in the chassis, and each of the plurality of receiver modules 33 can be controlled by the computer through the transmitter module 31.

2. Reducing the Number of Wires

The transmission interface 322 can transmit data. The power connector 321 provided for receiving power, and the emitter interface 323 associated with the transmission interface 322 and the power connector 321 can transmit data and power at the same time. The receiver module 33 only requires a set of wires for operation, which substantially improves the problem that the conventional light-emitting computer components must be equipped with transmission lines and power cables, so that the number of wires in the chassis can be substantially reduced.

3. Unrestricted Configuration

Since the plurality of connector modules 32 are set in a series connection, they can be extended to any location in the chassis, and the power connector 321 and the plurality of emitter interfaces 323 can be adjusted to respective corresponding locations by the guide rail 325 and the slider block 326. Therefore, based on the location of the power supply 22 and the plurality of receiver modules 33 in the chassis, the wires can be arranged at an appropriate distance and location, so that the location of the power supply 22 or the plurality of receiver modules 33 in the chassis will not be restricted due to short wire length.

In conclusion, a plurality of connector modules 32 set in series can be used to increase the number of the emitter interfaces 323, so that more receiver modules 33 can be installed in the chassis. Besides, only one set of wires is required between the each of the plurality of connector modules 32 and each of the plurality of the receiver module 33 for transmitting power and data, which significantly reduces the number of wires in the chassis. Moreover, the power connector 321 and the emitter interface 323 can be adjusted to respective corresponding locations by the guide rail 325 and the slider block 326, so that the location of the power supply 22 and the plurality of receiver modules 33 will not be restricted due to short wire length, which significantly simplifies the wiring configuration. Therefore, the aforementioned features of the invention can be achieved.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A single rail control system with receiver modules (33), associated with a motherboard (21) of a personal computer and a power supply (22), comprising:
    a transmitter module (31), including a first microcontroller (311), a control interface (312) associated with the first microcontroller (311), and a data interface (313) associated with the first microcontroller (311), wherein the motherboard (21) is associated with the control interface (312) to access the data of the first microcontroller (311);
    a connector module (32), including a power connector (321) provided for electrical connection with the power supply (22), a transmission interface (322) associated with the data interface (313), and at least one emitter interface (323) associated with the power connector (321) and the transmission interface (322); and
    at least one of the receiver modules (33), including a second microcontroller (331) associated with the emitter interface (323) of the connector module (32), an LED driver (332) associated with the second microcontroller (331), at least one RGB LED (333) associated with the LED driver (332), and a connector interface (334) associated with the second microcontroller (331), wherein the communication between the first microcontroller (311) and the second microcontroller (331) is bi-directional, the LED driver (332) controlled by the second microcontroller (331) drives the RGB LED (333) to emit light, the power supply (22) provides power to the receiver module (33) through the connector module (32), and the connector interface (334) of the receiver module (33) is associated with the emitter interface (323) of the connector module (32), so that the second microcontroller (331) is controlled by the first microcontroller (311), and the power provided from the power supply (22) is transmitted to the receiver module (33).

2. The single rail control system with receiver modules (33) as claimed in claim 1, wherein the connector module (32) further includes an expansion interface (324) associated with the transmission interface (322), the single rail control system further comprises another connector module (32) associated with the power supply (22), the expansion interface (324) of the first connector modules (32) associated with the transmitter module (31) is associated with the transmission interface (322) of another connector module (32).

3. The single rail control system with receiver modules (33) as claimed in claim 1, wherein the receiver module (33) further includes a DC/DC converter (335) associated with the connector module (32) and the LED driver (332), the DC/DC converter (335) converts the power provided from the power supply (22) into a usable power for the LED driver (332).

4. The single rail control system with receiver modules (33) as claimed in claim 3, wherein the power provided from the power supply (22) is DC12V, and is converted into DC5V by the DC/DC converter (335).

5. The single rail control system with receiver modules (33) as claimed in claim 1, the receiver module (33) further includes a fan driver (336) associated with the emitter interface (323) of the connector module (32) and the second microcontroller (331), and a fan (337) associated with the fan driver (336), the second microcontroller (331) is controlled by the first microcontroller (311) through the connector module (32), so that the fan (337) is driven to rotate by the fan driver (336) and the rotation speed is controllable.

6. The single rail control system with receiver modules (33) as claimed in claim 5, wherein the rotation speed of the fan (337) is detected by the fan driver (336), and the detected data is transmitted to the first microcontroller (311) by the second microcontroller (331).

7. The single rail control system with receiver modules (33) as claimed in claim 1, the receiver module (33) further includes a pump driver (338) associated with the connector module (32) and the second microcontroller (331), and a water block with pump (339) associated with the pump driver (338), the pump driver (338) is controlled by the second microcontroller (331), so that the water block with pump (339) is driven to rotate, and the rotation speed is controllable.

8. The single rail control system with receiver modules (33) as claimed in claim 1, wherein the connector module (32) further includes at least one guide rail (325), and at least one slider block (326) configured on the guide rail (325), the slider block (326) slides in the guide rail (325), and the power connector (321) sits on the slider block (326).

9. The single rail control system with receiver modules (33) as claimed in claim 1, wherein the connector module (32) further includes at least one guide rail (325), and at least one slider block (326) configured on the guide rail (325), the slider block (326) slides in the guide rail (325), and the emitter interface (323) sits on the slider block (326).

\* \* \* \* \*